METHOD FOR MANUFACTURING SEMICONDUCTOR DEVICES

Filed Feb. 28, 1967

INVENTOR
KAZUO FUJIMOTO

BY Stevens, Davis, Miller & Mosher

ATTORNEYS

United States Patent Office 3,461,549

Patented Aug. 19, 1969

3,461,549
METHOD FOR MANUFACTURING SEMICONDUCTOR DEVICES

Kazuo Fujimoto, Ashiya-shi, Japan, assignor to Matsushita Electronics Corporation, Osaka, Japan, a corporation of Japan Filed Feb. 28, 1967, Ser. No. 619,270
Claims priority, application Japan, Mar. 9, 1966, 41/14,492
Int. Cl. B01j *17/00;* H05k *13/00*
U.S. Cl. 29—577 4 Claims

ABSTRACT OF THE DISCLOSURE

A method for manufacturing semiconductor devices, particularly suitable for manufacturing plastic encapsulated semiconductor devices, in which the device comprises an insulating stem provided with a plurality of ridges having recessed portions and metallized surfaces. The semiconductor elements are mounted in the recessed portions and are connected by leads to the surfaces of the ridges. The resulting assembly is sealed with a sealing material, such as a resin, thereby enhancing mass production.

This invention relates to a method of manufacturing semiconductor devices, especially those devices having semiconductor elements sealed in recessed portions on an insulating stem by a sealing material such as resin.

The recent progress in the technique of surface passivation which is applied to semiconductor elements and which consists of coating the surfaces of such elements with a protective film such as silicon dioxide film has greatly simplified the process of sealing semiconductor devices, and various types of semiconductor devices encapsulated with a resin such as epoxy resin have been introduced into the market one after another.

The present invention will be described with respect to a preferred embodiment illustrated in the accompanying drawings, in which.

Figures 1, 2:
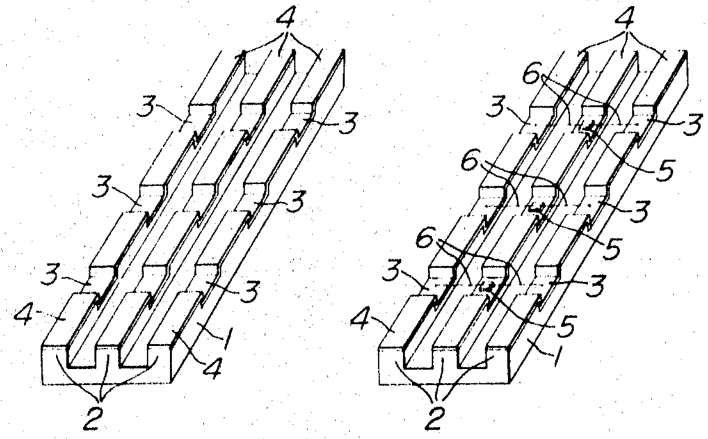
FIG. 1 is a perspective view of a stem body used in said embodiment and having a metal coating applied onto the upper faces of the ridges of said stem body.
FIG. 2 is a perspective view, illustrating said stem body with a semiconductor element of a transistor attached thereto.

In the drawings, FIG. 1 is a perspective view of a stem body 1 for a transistor, said stem body 1 being provided in tape form and is shown here as being in the stage prior to being severed into individual minute sections and being of the structure comprising three parallel ridges 2 having recessed portions 3 disposed at predetermined uniform intervals longitudinally thereof and having metal films 4 applied onto the upper surfaces thereof, respectively. Said stem body 1 is made of a material such as ceramic. This stem body 1 is prepared by subjecting a material having the property of heat-resistance and electric insulation and of being chemically stable, to press-moulding. A metal film 4 is formed on each of the upper faces of said three ridges 2 of the stem body 1 by metallizing said faces with molybdenum and thereafter plating the resulting surfaces with nickel and then with gold, so that the upper surfaces of the protruding portions and the recessed portions of the stem body 1 are equally continuously covered with the metal films, respectively.

This stem body 1 is of a length in the order of from 5 to 10 cm. As shown in FIG. 2, the collectors of the individual silicon planar transistor elements having passivated surfaces and provided with electrodes for emitter and base regions are soldered to the metal film 4 formed on the surfaces of the recessed portions 3 of the central ridge 2 of the stem body 1 respectively.

Figure 3:
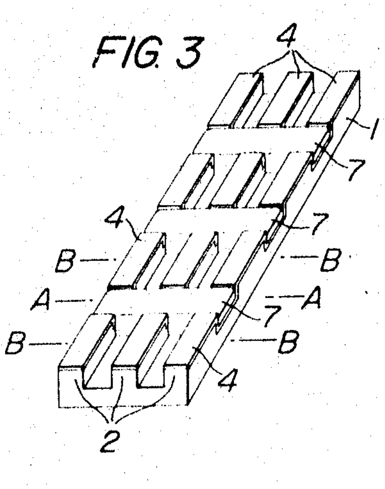
FIG. 3 is a perspective view, illustrating said semiconductor element in FIG. 2 being sealed with a resin coating.

Then with lead wires 6, the emitter electrodes and the base electrodes are connected, by the thermo-compression bonding technique, to the metal films 4 located on the plurality of recessed portions 3 provided on the ridges 2 on both sides of the stem body, respectively. By arranging the depths of the recessed portions 3 provided on the central ridge of the stem body 1 so as to be greater than the depths of the recessed portions 3 provided on the ridges 2 on both outer sides of the stem body 1 by the amount of thickness of the semiconductor element 5, there is provided a convenience, along with the fact that the respective sites where said electrodes have been bonded by thermo-compression are disposed in the same plan and in view of the fact that the operation of said thermal bonding of the lead wires can thus be effected only by setting the position of the thermo-bonding machine in only the horizontal direction, the thermo-bonding operation can be effected on the mass-production scale. In this manner, semiconductor elements 5 of a plurality of transistors are attached onto the surface of the stem body 1, with the upper faces of the individual elements 5 being positioned so as to be lower than the level of the protruding portions of the ridges 2. While it is not always necessary to coat the elements 5 with a material such as resin, it is the practice with most of the instances to seal the entire elements including their lead wires 6 with epoxy resin 7, as shown in FIG. 3. In such sealing operation, it is desirable in particular that the resin is applied onto the elements so that the upper surface of each sealing resin is slightly lower than the level of the upper faces of the protruding portions of the ridges 2 of the stem body 1. After the completion of the sealing, the stem body 1 is severed into individual sections along the line A—A or B—B as shown in FIG. 3, according to the present invention, with the result that the fabrication of the individual transistors as shown in FIG. 4(*a*) and FIG. 4(*b*) are completed.

Figure 4A:
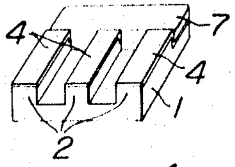
FIG. 4(*a*) and FIG. 4(*b*) are perspective views of a transistor, taken along the lines A—A and B—B, respectively, of the stem body in FIG. 3.
Figure 4B:
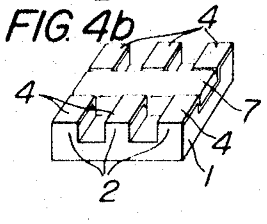

As is clearly understood from FIG. 4(*a*) or FIG. 4(*b*), the transistor obtained according to the present invention is of a quite simplified and yet sturdy structure. The metal films 4 formed on the three ridges 2 of the stem body 1 and having no coating of resin film 7 can be utilized as the outer-lead wires for the emitter, collector and base regions, and there is no need at all of providing any additional outer-lead wires. When the coating formed with a resin or like sealing material is disposed so as to be lower than the level of the faces of the metal films 4, it is possible to effect simultaneous compression bonding of a plurality of transistors of the present invention when it is desired to apply the transistors to, for example, printed wiring boards, whereby not only the number of the wiring steps can be reduced but also the simultaneous compression bonding of transistors which is the technique that has become popular in the industry of this field as the face-bonding technique is made possible. It is to be noted, however, that this method of simultaneous attachment of transistors by compression which is known as the face-bonding technique does not necessarily require that the semiconductor elements be sealed with a coating which is formed with a material such as resin. It is also to be noted that where the semiconductor devices are produced according to the aforesaid process of the present invention, the stem shown in FIG. 1 can be made by subjecting the material to press-moulding, and the metal films 4 which are formed on the upper faces of the ridges 2 of the stem body 1 can be applied thereto by the use of the known plating technique. These facts not only make it possible to process a large number of transistors at a time, but also to fully automatize the step of attachment of the elements 5 by the use of an apparatus designed so as to feed the stem body 1 at a predetermined pitch, whereby the device can be fabricated quite readily and at a greatly reduced cost.

Descriptions have been directed to an embodiment of the invention with respect to the fabrication of transistors. However, the present invention can be applied equally to diodes by merely forming the stem body 1 so as to have only two ridges 2.

As has been stated, the method of the present invention is effective in facilitating the production of the semiconductor device of the present invention at a much reduced cost.

It should be understood that the present invention is not restricted to the afore-described embodiment alone, and that various modifications of the present invention may be made by those skilled in the art without departing from the spirit of the invention.

What is claimed is:

1. A method for fabricating semiconductor devices comprising the first step of forming metal films on the upper surfaces of a plurality of parallel ridges each locally having a recessed portion so that each of said ridges consists of a recessed portion and at least one protruding portion, said parallel ridges being provided on a plate-form electric-insulating stem body, said films being formed so as to extend continuously from said upper surfaces of the protruding portions of the ridges to the upper surfaces of the recessed portions, respectively; the second step of attaching a semiconductor element onto the recessed portion of one of said ridges in such manner that the upper face of said element is lower than the level of the upper surfaces of the protruding portions of said ridges and of electrically connecting the electrodes of said element onto the metal films provided on the upper surfaces of said recessed portions of the ridges, respectively; and the third step of sealing said element with a sealing material made of a synthetic resin.

2. A method for fabricating semiconductor devices comprising the first step of forming a continuous film on each of the upper surfaces of a plurality of parallel ridges each having a plurality of recessed portions disposed longitudinally thereof and at predetermined intervals so that each ridge consists of recessed portions and protruding portions, said ridges being provided on a tape-form electric-insulating stem body; the second step of attaching a semiconductor element onto the upper face of each of said recessed portions of one of said ridges in such manner that the upper face of said element is lower than the level of the upper surfaces of the protruding portions and of electrically connecting the electrodes of each of said elements onto the metal films provided on the recessed portions of said ridges, respectively; the third step of thereafter sealing each of said elements with a sealing material made of a synthetic resin; and the fourth step of subsequently cutting off said tape-form stem body at substantially right angles relative to the longitudinal length of said stem body so that each section has one semiconductor element thereon.

3. A method for manufacturing semiconductor devices according to claim 1, wherein said sealing step is achieved in such manner that the upper face of said sealing material covering the element is not higher than the level of the upper surface of said protruding portions of the ridges.

4. A method for manufacturing semiconductor devices according to claim 2, wherein said sealing step is achieved in such manner that the upper face of said sealing material covering the element is not higher than the level of the upper surface of said protruding portions of the ridges.

References Cited

UNITED STATES PATENTS

| | | | |
|---|---|---|---|
| 3,084,300 | 4/1963 | Sanchez. | |
| 3,271,507 | 9/1966 | Elliott | 174—52 |
| 3,349,481 | 10/1967 | Karp | 29—588 X |

PAUL M. COHEN, Primary Examiner

U.S. Cl. X.R.

29—589, 626, 52.6, 101